(12) United States Patent
Yoo et al.

(10) Patent No.: US 12,224,163 B2
(45) Date of Patent: Feb. 11, 2025

(54) ION BEAM SOURCE, SUBSTRATE PROCESS APPARATUS INCLUDING THE SAME, AND METHOD OF PROCESSING A SUBSTRATE USING THE SAME

(71) Applicant: SAMSUNG ELECTRONICS CO., LTD., Suwon-si (KR)

(72) Inventors: SeungWan Yoo, Suwon-si (KR); Jeongyeon Lee, Suwon-si (KR); Dohyung Kim, Suwon-si (KR); Jaehong Park, Suwon-si (KR); Dong-Chan Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/234,123

(22) Filed: Aug. 15, 2023

(65) Prior Publication Data
US 2024/0062996 A1    Feb. 22, 2024

(30) Foreign Application Priority Data
Aug. 17, 2022    (KR) .................. 10-2022-0102714

(51) Int. Cl.
*H01J 37/32* (2006.01)
*C23C 14/34* (2006.01)
*H01J 27/02* (2006.01)
*H01J 37/08* (2006.01)
*H01J 37/305* (2006.01)
*H01J 37/34* (2006.01)

(52) U.S. Cl.
CPC .... *H01J 37/32697* (2013.01); *C23C 14/3442* (2013.01); *H01J 27/024* (2013.01); *H01J 37/08* (2013.01); *H01J 37/3053* (2013.01); *H01J 37/3211* (2013.01); *H01J 37/32357* (2013.01); *H01J 37/32422* (2013.01); *H01J 37/34* (2013.01); *H01J 2237/081* (2013.01); *H01J 2237/332* (2013.01)

(58) Field of Classification Search
CPC .... H01J 37/32697; H01J 27/024; H01J 37/08; H01J 37/3053; H01J 37/3211; H01J 37/32357; H01J 37/32422; H01J 37/34; H01J 2237/081; H01J 2237/332; H01J 2237/061; H01J 2237/083; H01J 2237/3321; H01J 2237/334; C23C 14/3442
See application file for complete search history.

(56) References Cited

U.S. PATENT DOCUMENTS 7,695,590 B2 *  4/2010  Hanawa ................ C23C 16/045
                                                     156/345.43
8,309,937 B2   11/2012  Kameyama
(Continued)

FOREIGN PATENT DOCUMENTS

JP    2001-143254 A    5/2001
JP         4431779 B2    3/2010

*Primary Examiner* — David A Vanore
(74) *Attorney, Agent, or Firm* — Sughrue Mion, PLLC

(57) ABSTRACT

An ion beam source including a plasma chamber including a plasma generating space, a plasma generator configured to generate plasma in the plasma generating space, a first grid connected to the plasma chamber, a second grid connected to the plasma chamber, and a first grid driver connected to the first grid. The first grid driver may be configured to move the first grid relative to the second grid.

20 Claims, 15 Drawing Sheets

(56) References Cited

U.S. PATENT DOCUMENTS

| | | | |
|---|---|---|---|
| 8,564,225 B1* | 10/2013 | Hailey | H05H 9/042 |
| | | | 315/504 |
| 9,330,885 B2* | 5/2016 | Feldbaum | H01J 37/30 |
| 10,347,459 B2* | 7/2019 | Park | H01J 37/32357 |
| 11,264,212 B1* | 3/2022 | Chen | H01J 37/08 |
| 11,289,339 B2 | 3/2022 | Tabata | |
| 2003/0102086 A1* | 6/2003 | Garcia | C23F 4/00 |
| | | | 156/345.39 |
| 2008/0202920 A1* | 8/2008 | Iwaya | H01J 37/3053 |
| | | | 204/192.34 |
| 2012/0080308 A1 | 4/2012 | Kameyama | |
| 2017/0207077 A1* | 7/2017 | Nagorny | H01J 37/32009 |
| 2023/0245865 A1* | 8/2023 | Lin | H01J 37/32633 |
| | | | 156/345.51 |
| 2024/0062996 A1* | 2/2024 | Yoo | H01J 37/08 |

\* cited by examiner

ION BEAM SOURCE, SUBSTRATE PROCESS APPARATUS INCLUDING THE SAME, AND METHOD OF PROCESSING A SUBSTRATE USING THE SAME

CROSS-REFERENCE TO RELATED APPLICATIONS

This application claims priority to Korean Patent Application No. 10-2022-0102714, filed on Aug. 17, 2022, in the Korean Intellectual Property Office, the disclosure of which is incorporated by reference herein in its entirety.

BACKGROUND

The present disclosure relates to an ion beam source, a substrate process apparatus including the same, and a method of processing a substrate using the same, and in particular, to an ion beam source capable of controlling an energy of an ion beam, a substrate process apparatus including the same, and a method of processing a substrate using the same.

A semiconductor device is fabricated through various processes. For example, the semiconductor device is fabricated by performing a photolithography process, an etching process, and a deposition process on a silicon wafer. An ion beam may be used in the etching process or the deposition process. The ion beam may be generated by an ion beam source, which is configured to extract ions from plasma. A grid may be used to extract the ions from the plasma. In many cases, a plurality of stacked grids are used in the process. The ion beam is generated by extracting ions passing through holes formed in each of the grids. The ion beam may be irradiated onto a target or a substrate.

SUMMARY

One or more embodiment provides an ion beam source, which is configured to control an energy of an ion beam, a substrate process apparatus including the same, and a method of processing a substrate using the same.

According to an aspect of an embodiment, an ion beam source includes: a plasma chamber comprising a plasma generating space; a plasma generator configured to generate plasma in the plasma generating space; a first grid connected to the plasma chamber; a second grid connected to the plasma chamber; and a first grid driver connected to the first grid, wherein the first grid driver is configured to move the first grid relative to the second grid.

According to an aspect of an embodiment, a substrate process apparatus includes: an ion beam source; and a substrate holder spaced apart from the ion beam source, wherein the ion beam source comprises: a plasma chamber comprising a plasma generating space; a plasma generator configured to generate plasma in the plasma generating space; a plurality of grids connected to the plasma chamber; and a grid driver configured to move one of the plurality of grids relative to the other ones of the plurality of grids.

According to an aspect of an embodiment, a substrate processing method includes: placing a substrate in a substrate process apparatus; and emitting an ion beam from an ion beam source spaced apart from the substrate, wherein the ion beam source comprises: a plasma chamber providing a plasma generating space; a plasma generator configured to generate plasma in the plasma generating space; a first grid connected to the plasma chamber; a second grid connected to the plasma chamber; and a first grid driver connected to the first grid, wherein the first grid driver is configured to move the first grid relative to the second grid.

BRIEF DESCRIPTION OF THE DRAWINGS

The above and other aspects and features will be more apparent from the following description of example embodiments, taken in conjunction with the accompanying drawings, in which.

DETAILED DESCRIPTION

Figure 1:
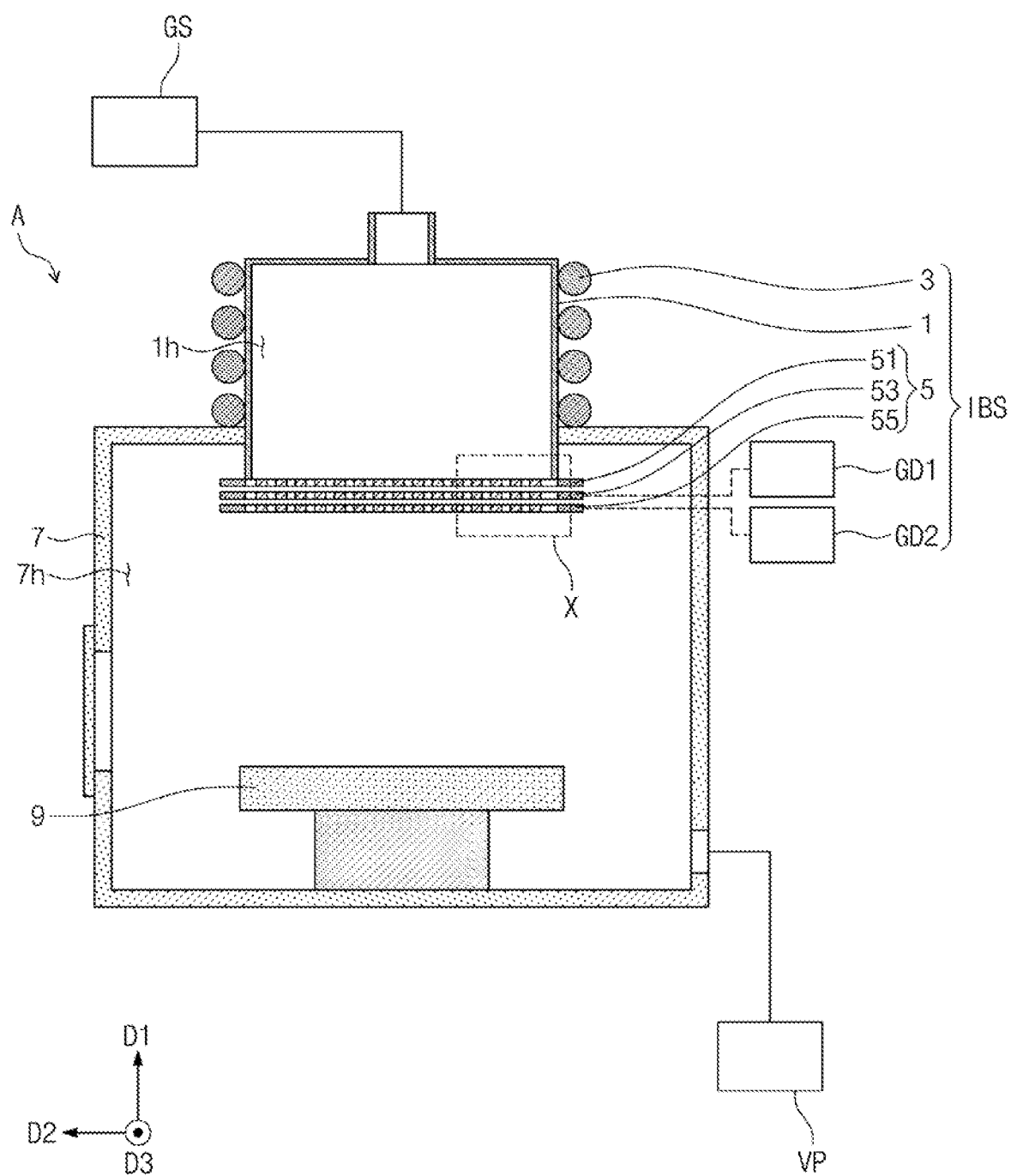
FIG. 1 is a sectional view illustrating a substrate process apparatus according to an embodiment.

Example embodiments will be described more fully with reference to the accompanying drawings, in which example embodiments are shown. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Like reference numerals in the drawings denote like elements, and thus their description will be omitted.

FIG. 1 is a sectional view illustrating a substrate process apparatus according to an embodiment.

In the present application, the reference numbers D1, D2, and D3 will be used to denote a first direction, a second direction, and a third direction, respectively, with the directions being not parallel to each other. The first direction D1 may be referred to as a vertical direction. In addition, each of the second and third directions D2 and D3 may be referred to as horizontal directions. The second direction D2 may be perpendicular to the third direction D3.

Referring to FIG. 1, a substrate process apparatus A may be provided. The substrate process apparatus A may be an apparatus that is configured to process a substrate using an ion beam. For example, the substrate process apparatus A may be configured to perform an etching process on a substrate using an ion beam. However, embodiments are not limited to this example, and in some embodiments, the substrate process apparatus A may be configured to perform another process. For example, the substrate process apparatus A may be used for an ion beam deposition (IBD) process of forming a deposition layer on a substrate using an ion beam. This will be described in more detail with reference to FIG. 15. In an embodiment, the substrate may be a silicon wafer, but embodiments are not limited to this example. The substrate process apparatus A may include an ion beam source IBS, a process chamber 7, a substrate holder 9, a gas supplying part GS, and a vacuum pump VP.

The ion beam source IBS may generate an ion beam. The ion beam may be composed of ions extracted from plasma. The ion beam emitted from the ion beam source IBS may be injected into the process chamber 7. The ion beam may be used to treat the substrate. In order to treat the substrate, in an embodiment the ion beam source IBS may include a plasma chamber 1, a plasma generator 3, a grid 5, and a grid driver.

The plasma chamber 1 may include a plasma generating space 1h. The plasma generating space 1h may be connected to the gas supplying part GS. In the plasma generating space 1h, a portion of gas supplied from the gas supplying part GS may be transformed to plasma.

The plasma generator 3 may be coupled to the plasma chamber 1. The plasma generator 3 may generate plasma in the plasma generating space 1h. The plasma generator 3 may include an RF coil to generate or help generate the plasma. The RF coil may surround or enclose the plasma chamber 1. An electric field and/or a magnetic field may be produced in the plasma generating space 1h by the RF coil. In this case, a portion of the gas, which is supplied into the plasma generating space 1h, may be transformed to plasma. For example, the plasma may be generated in the plasma generating space 1h by an inductively-coupled plasma (ICP). However, embodiments are not limited to this example, and in an embodiment, the plasma generator 3 may include a device other than or in addition to the RF coil for generating the plasma.

The grid 5 may be connected to the plasma chamber 1. The grid 5 may allow ions to be extracted from the plasma in the plasma generating space 1h. In an embodiment, a plurality of grids may be provided. For example, the grid 5 may include a first grid 51, a second grid 53, and a third grid 55, as shown in FIG. 1. Each of the first, second, and third grids 51, 53, and 55 may have a plate shape extending perpendicular to the first direction D1. That is, each of the first, second, and third grids 51, 53, and 55 may have, for example, a plate shape in a plan view. Each of the first, second, and third grids 51, 53, and 55 may have a plate shape in a plane defined by the second direction D2 and the third direction D3. As an example, each of the first, second, and third grids 51, 53, and 55 may have a circular plate shape. The first, second, and third grids 51, 53, and 55 may be spaced apart from one another along the first direction D1. The ions, which are extracted from the plasma in the plasma generating space 1h, may pass through the first, second, and third grids 51, 53, and 55 sequentially and may be injected into the process chamber 7. The first grid 51 may be grounded. In other words, the first grid 51 may be a ground grid. The second grid 53 may be a screen grid. The third grid 55 may be an accelerating grid. Each of the first, second, and third grids 51, 53, and 55 may be formed of or include at least one of stainless steel (SUS), carbon graphite, copper (Cu), or aluminum (Al), but embodiments are not limited to this example. Although an example in which three grids are provided is illustrated, embodiments are not limited to this example. For example, the substrate process apparatus A may be configured to include four or more grids. However, for convenience in illustration, the description that follows will refer to an example in which three grids are provided. The grid 5 will be described in more detail below.

The grid driver may be configured to move a portion of the grid 5. More specifically, the grid driver may be configured to move any one of the grids 51, 53, 55 relative to the remaining ones of the grids 51, 53, 55. The grid driver may be configured to move the grids 51, 53, 55 translationally or rotationally. For example, the grid driver may be configured to move the second grid 53 relative to the first grid 51 in the first direction D1 and/or the second direction D2 and driver may be configured to move the third grid 55 relative to the first grid 51 in the first direction D1 and/or the second direction D2. In an embodiment, the grid driver may be configured to rotate the second grid 53 about an axis parallel to the first direction D1. In an embodiment, the substrate process apparatus A may be provided to include a plurality of grid drivers. For example, a first grid driver GD1 and a second grid driver GD2 may be provided in the substrate process apparatus A.

The first grid driver GD1 may be configured to move the second grid 53. For example, the first grid driver GD1 may be configured to move the second grid 53 in the first direction D1, the second direction D2, and/or the third direction D3 relative to the first grid 51 whose position is fixed. In an embodiment, the first grid driver GD1 may be configured to rotate the second grid 53 about an axis parallel to the first direction D1, when the first grid 51 is fixed. For this, the first grid driver GD1 may include an actuator, such as a motor or a hydraulic device. In addition, the first grid driver GD1 may be configured to deliver a driving power, which is generated by the actuator, to the second grid 53. However, embodiments are not limited to this example, and in an embodiment, the first grid driver GD1 may include another device that can be used to move the second grid 53.

The second grid driver GD2 may be configured to move the third grid 55. For example, the second grid driver GD2 may be configured to move the third grid 55 in the first direction D1, the second direction D2, and/or the third direction D3, when the first grid 51 is fixed. In an embodiment, the second grid driver GD2 may be configured to rotate the third grid 55 about an axis parallel to the first direction D1, when the first grid 51 is fixed. For this, the second grid driver GD2 may include an actuator, such as a motor or a hydraulic device. In addition, the second grid driver GD2 may be configured to deliver a driving power, which is generated by the actuator, to the third grid 55. However, embodiments are not limited to this example, and in an embodiment, the second grid driver GD2 may include another device that can be used to move the third grid 55.

The gas supplying part GS may be connected to the plasma generating space 1h. The gas supplying part GS may be configured to supply a process gas into the plasma chamber 1. For this, the gas supplying part GS may include, for example, a gas tank, a compressor, a valve, and so forth.

The process chamber 7 may provide a process space 7h. A process on the substrate may be performed in the process space 7h. The process chamber 7 may be connected to the ion beam source IBS. For example, the ion beam source IBS may be connected to a portion of the process chamber 7. The plasma generating space 1h and the process space 7h may be connected to each other through the grid 5. However, embodiments are not limited to this example, and in an embodiment, the process chamber 7 may surround or enclose the ion beam source IBS. In some embodiments, the process chamber 7 and the ion beam source IBS may be spaced apart from each other.

The substrate holder 9 may be placed in the process chamber 7. The substrate holder 9 may be spaced apart from the ion beam source IBS. For example, as shown in FIG. 1, the substrate holder 9 may be spaced apart from the ion beam source IBS in a downward direction such that the substrate holder 9 is below the ion beam source IBS. The substrate holder 9 may be used to fasten the substrate to a specific position in the process space 7h. For this, the substrate holder 9 may include, for example, an electrostatic chuck (ESC) and/or a vacuum chuck. However, embodiments are not limited to this example, and in an embodiment, the substrate may be disposed on the substrate holder 9 without an additional fastening force.

The vacuum pump VP may be connected to the process space 7h. The vacuum pump VP may be used to maintain the process space 7h to a substantially vacuum state during a fabrication process.

Figure 2:
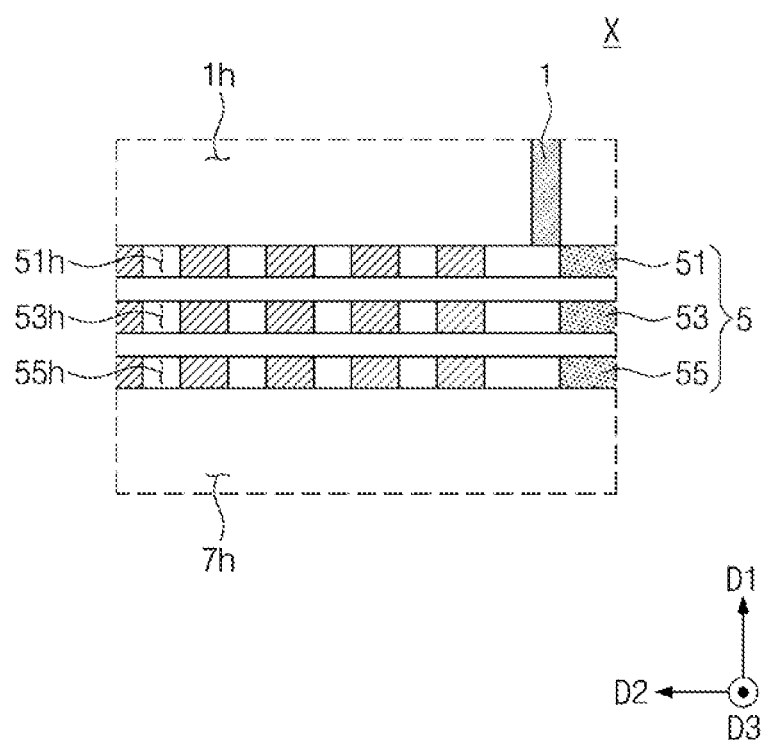
FIG. 2 is an enlarged sectional view illustrating a portion 'X' of FIG. 1.
Figure 3:
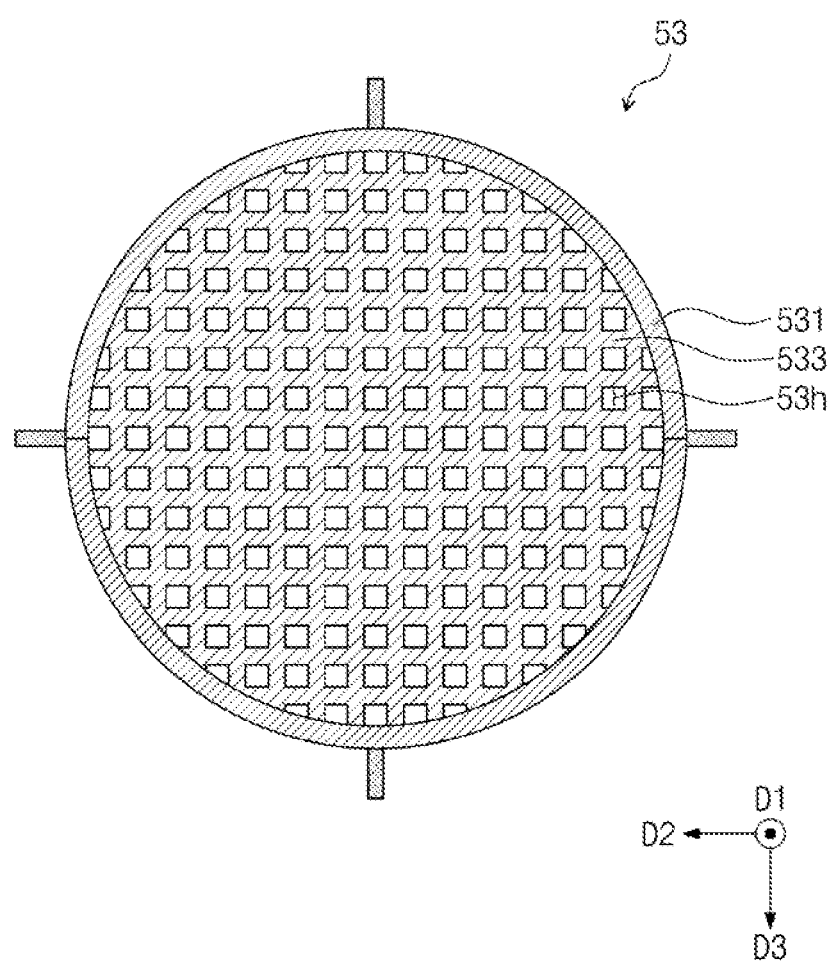
FIG. 3 is a plan view illustrating a grid according to an embodiment.

FIG. 2 is an enlarged sectional view illustrating a portion 'X' of FIG. 1, and FIG. 3 is a plan view illustrating a grid according to an embodiment of the inventive concept.

Referring to FIGS. 2 and 3, the second grid 53 may include a grid supporting member 531 and a blocking bar 533. The grid supporting member 531 may have a ring shape. For example, the grid supporting member 531 may have a circular ring shape, as shown in FIG. 3. The blocking bar 533 may be coupled to the grid supporting member 531. In an embodiment, the second grid 53 may include a plurality of blocking bars 533. The blocking bars 533 may be spaced apart from each other in the second direction D2 and/or the third direction D3. Accordingly, a grid penetration hole 53h may be provided between the blocking bars 533. The grid penetration hole 53h may be a hole that extends in the first direction D1. The grid penetration hole 53h may have a rectangular shape, when viewed in a plan view, as shown in FIG. 3, but embodiments are not limited to this example. In an embodiment, the grid penetration hole 53h may be defined by the blocking bars 533, but embodiments are not limited to this example. For example, the grid penetration holes 53h may be provided in the second grid 53 of a circular plate shape.

Each of the first and third grids 51 and 55 may also be provided to have features and a shape that are the same as or similar to that of the second grid 53. For example, the first grid 51 may be provided to have a grid penetration hole 51h. In addition, the third grid 55 may be provided to have a grid penetration hole 55h. The plasma generating space 1h and the process space 7h may be connected to each other through the grid penetration hole 51h of the first grid 51, the grid penetration hole 53h of the second grid 53, and the grid penetration hole 55h of the third grid 55.

Figure 4:
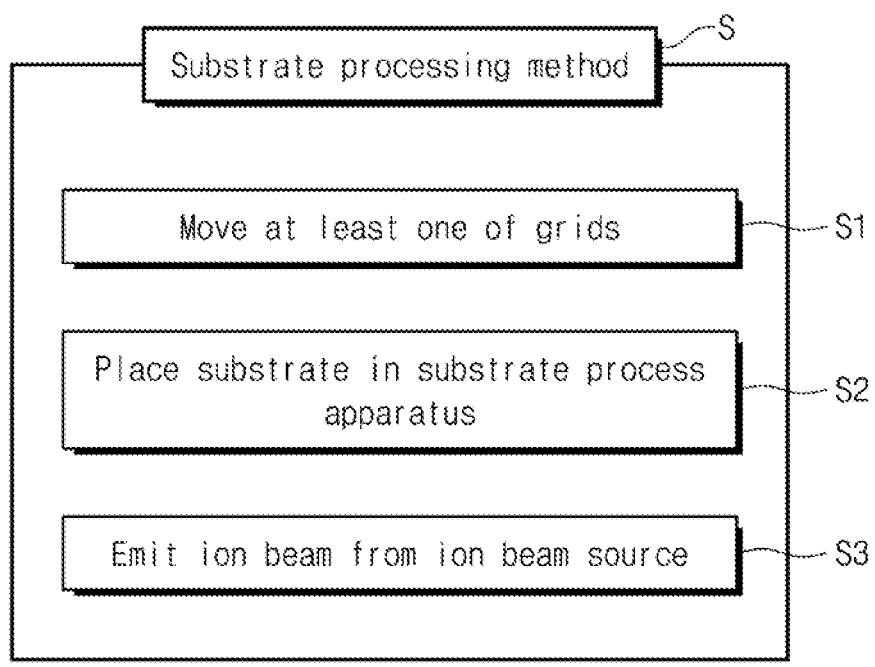
FIG. 4 is a flow chart illustrating a substrate processing method according to an embodiment.

FIG. 4 is a flow chart illustrating a substrate processing method according to an embodiment.

Referring to FIG. 4, a substrate processing method S may be provided. The substrate processing method S may be used in a process of treating a substrate using the substrate process apparatus A described with reference to FIGS. 1 to 3. The substrate processing method S may include moving at least one of grids (in S1), placing a substrate in a substrate process apparatus (in S2), and emitting an ion beam from an ion beam source (in S3).

Hereinafter, the substrate processing method S of FIG. 4 will be described in more detail with reference to FIGS. 5 to 10.

FIGS. 5 to 10 are diagrams illustrating a substrate processing method according to the flow chart of FIG. 4.

Figure 5:
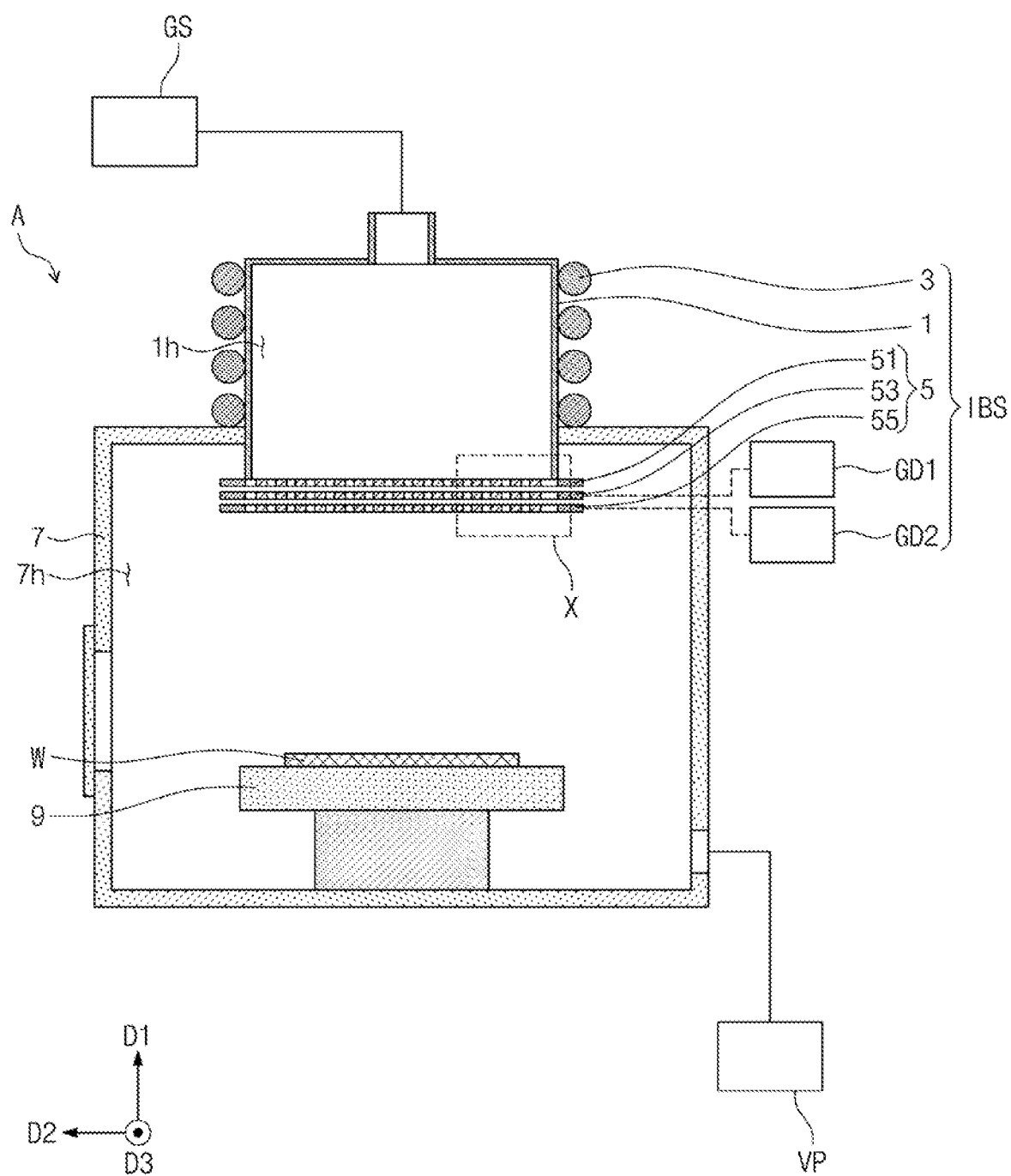
FIGS. 5 to 10 are diagrams illustrating a substrate processing method according to the flow chart of FIG. 4.
Figure 6:
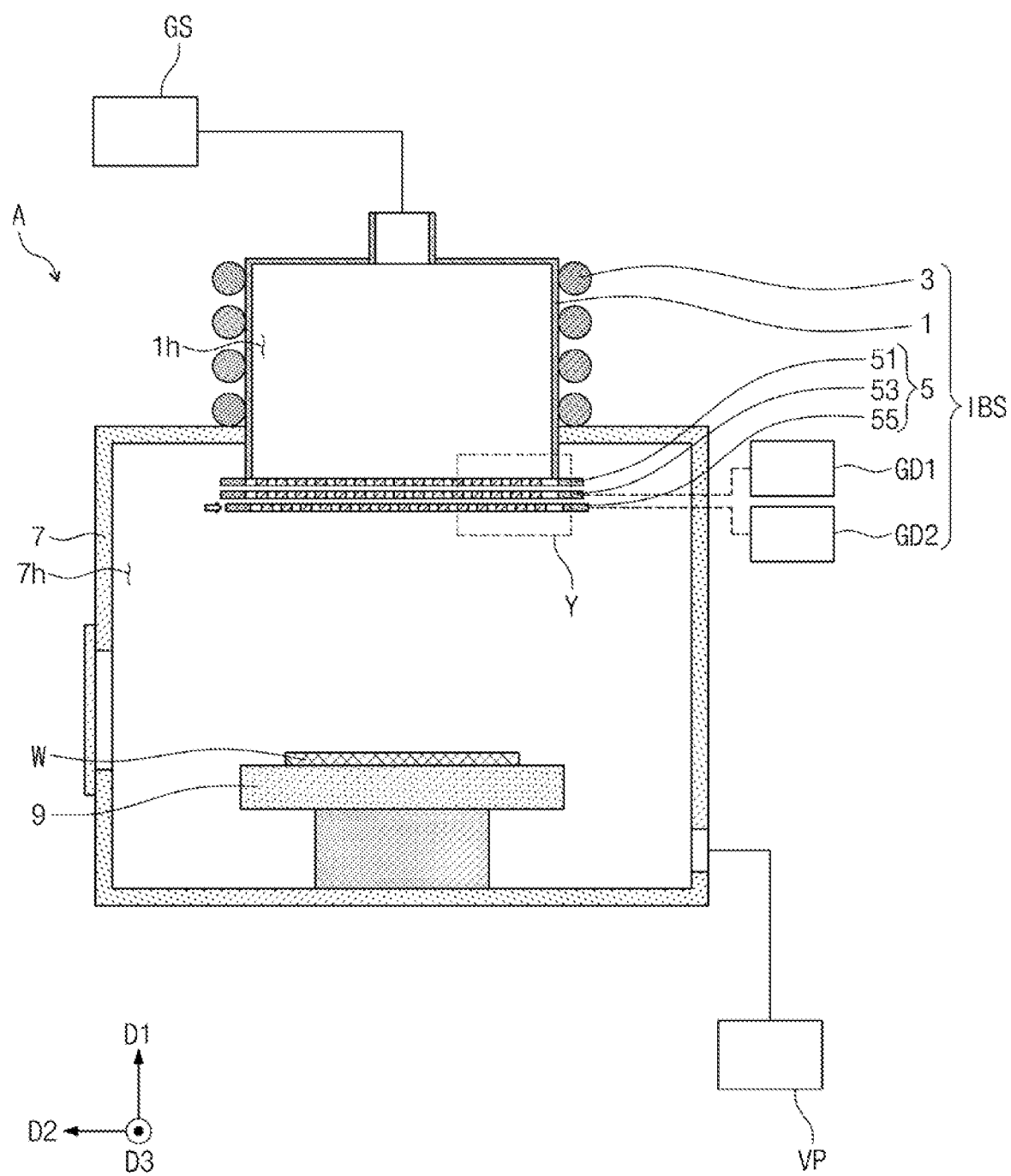
Figure 7:
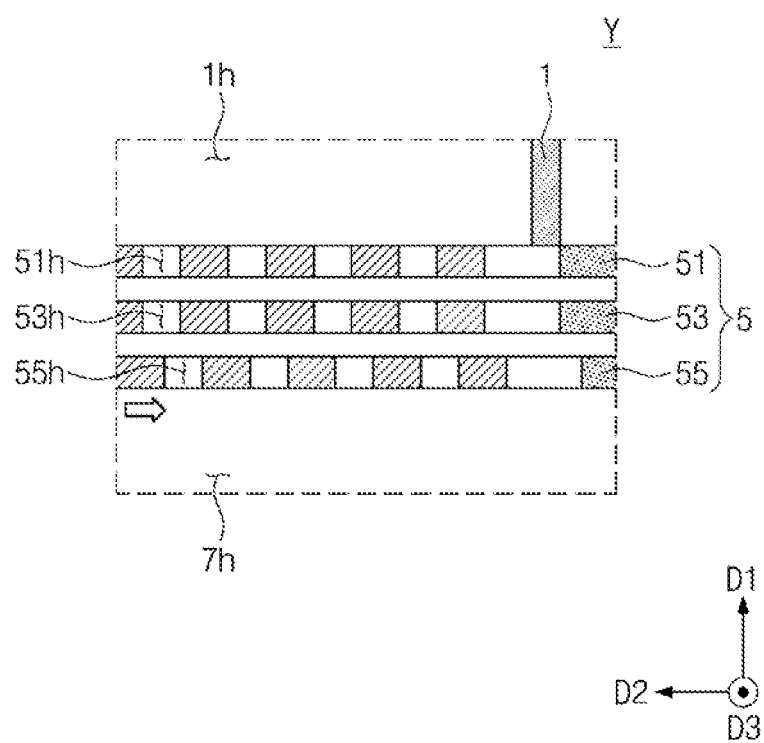
Figure 8:
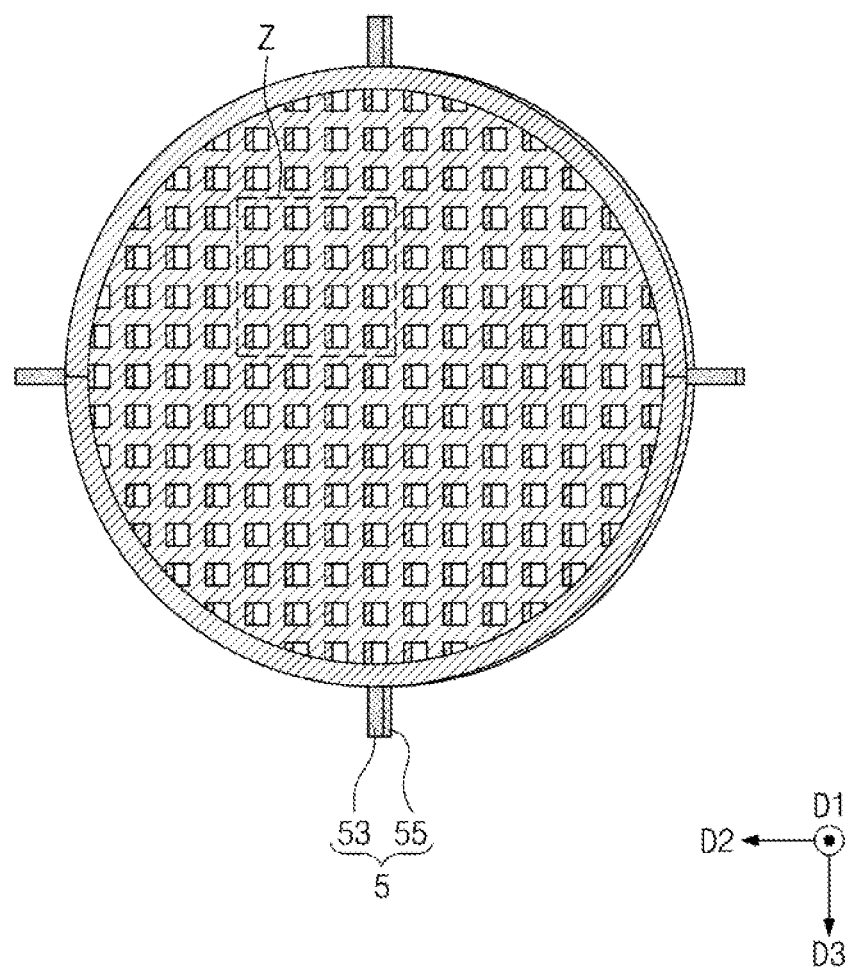

Referring to FIGS. 5 and 4, the placing of the substrate in the substrate process apparatus (in S2) may include loading a substrate W on the substrate holder 9. The substrate W may be a silicon wafer, but embodiments are not limited to this example. The substrate holder 9 may be configured to fasten the substrate W to a specific position. For example, the substrate holder 9 may be configured to fasten the substrate W to a specific position in the process space 7h using an electrostatic force and/or a vacuum pressure. The substrate W, which is placed on the substrate holder 9, may be spaced apart from the ion beam source IBS.

Figure 9:
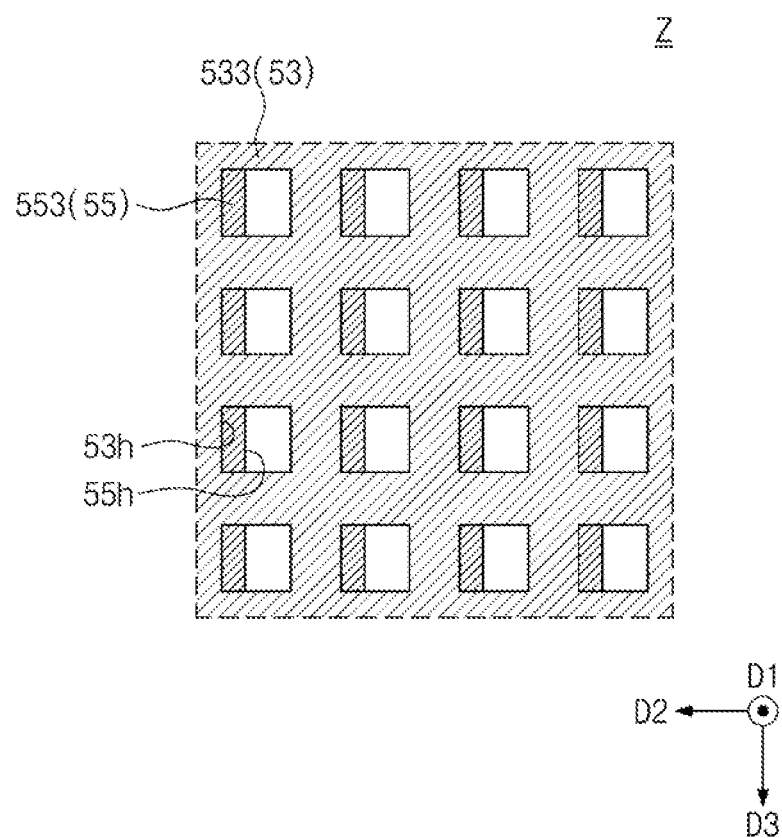

Referring to FIGS. 6, 7, 8, 9, and 4, the moving of at least one of the grids (in S1) may include moving the third grid 55 relative to the second grid 53 using the second grid driver GD2. For example, the second grid driver GD2 may be used to move the third grid 55 in a horizontal direction. More specifically, for example, when the second grid 53 is fastened to a specific position, the third grid 55 may be moved in the second direction D2 by the second grid driver GD2. Accordingly, the grid penetration hole 55h of the third grid 55 may be misaligned or offset from the grid penetration hole 53h of the second grid 53. In other words, when viewed in a plan view, an area of an overlap region between the grid penetration holes 55h and 53h of the third and second grids 55 and 53 may be changed. For example, as shown in FIG. 9, the area of the overlap region between the grid penetration holes 55h and 53h of the third and second grids 55 and 53 may be reduced by the moving of the third grid 55. This may lead to a change in an energy of an ion beam extracted from the plasma chamber 1. The steps S1 to S3 shown in FIG. 4 may be performed in the order shown from S1 to S3, but embodiments are not limited thereto. For example, one or more steps may be performed concurrently or may be performed concurrently but in an order different than shown in FIG. 4. Steps performed concurrently may be performed partially concurrently such that a portion of the steps overlap. For example, in an embodiment, the moving of at least one of the grids (S1) may occur before, concurrently, partially concurrently or after the placing of the substrate in the substrate process apparatus (S2).

Figure 10:
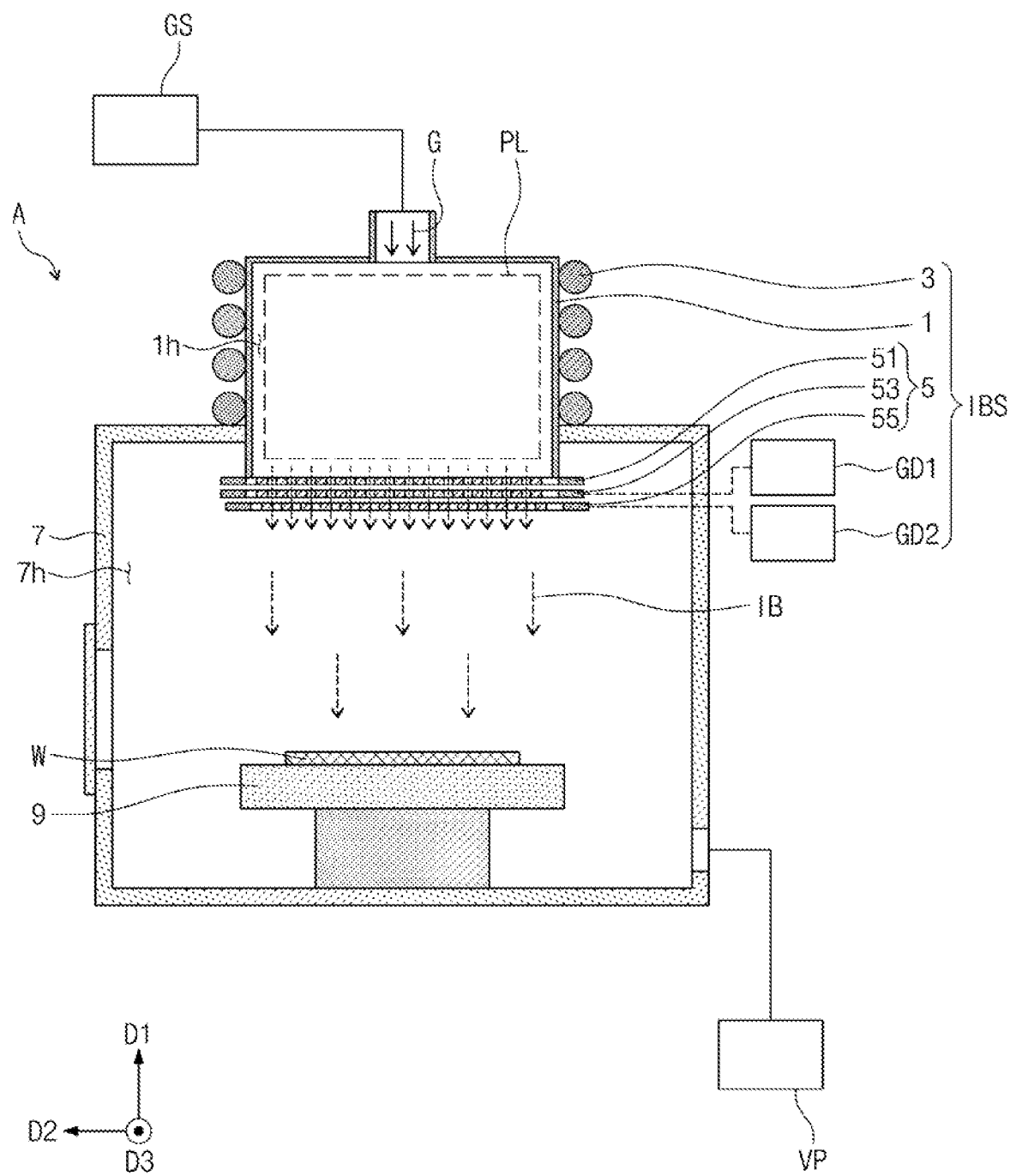

Referring to FIGS. 10 and 4, a process gas G may be supplied from the gas supplying part GS into the plasma chamber 1. The plasma generator 3 may be configured to transform a portion of the process gas G in the plasma generating space 1h to plasma PL. The emitting of the ion beams IB from the ion beam source (in S3) may include extracting ions from the plasma PL using the grid 5. The ions may pass through the first, second, and third grids 51, 53, and 55 sequentially and then may be supplied into the process space 7h. Ion beams IB may move toward the substrate W. The substrate W may be processed by the ion beams IB. For example, the substrate W may be etched by the ion beams IB.

In the ion beam source according to an embodiment, a substrate process apparatus including the same, and a method of processing a substrate using the same, it may be possible to control an ion beam, which is extracted from an ion beam source. For example, by moving at least one of the grids relative to the remaining ones of the grids in a horizontal direction, it may be possible to adjust an overlapped area between grid penetration holes, in a plan view. When an energy of an ion is within a specific range, the ion can pass through all of the grid penetration holes. If the overlapped area between the grid penetration holes is changed, an energy of an ion that can pass through all of them may also be changed. Thus, an energy of the ion beam extracted from the ion beam source may be controlled by moving at least one of the grids. Furthermore, according to an embodiment of the inventive concept, it may be possible to control a propagation direction of the ion beam.

The ion beam source according to an embodiment, a substrate process apparatus including the same, and a method of processing a substrate using the same may be adaptively used for various processes. For example, an energy of an ion beam may be adjusted such that it is within an energy range required by a process recipe for each process. This may mean that the apparatus according to an embodiment can be used for various processes with different process recipes.

Figure 11:
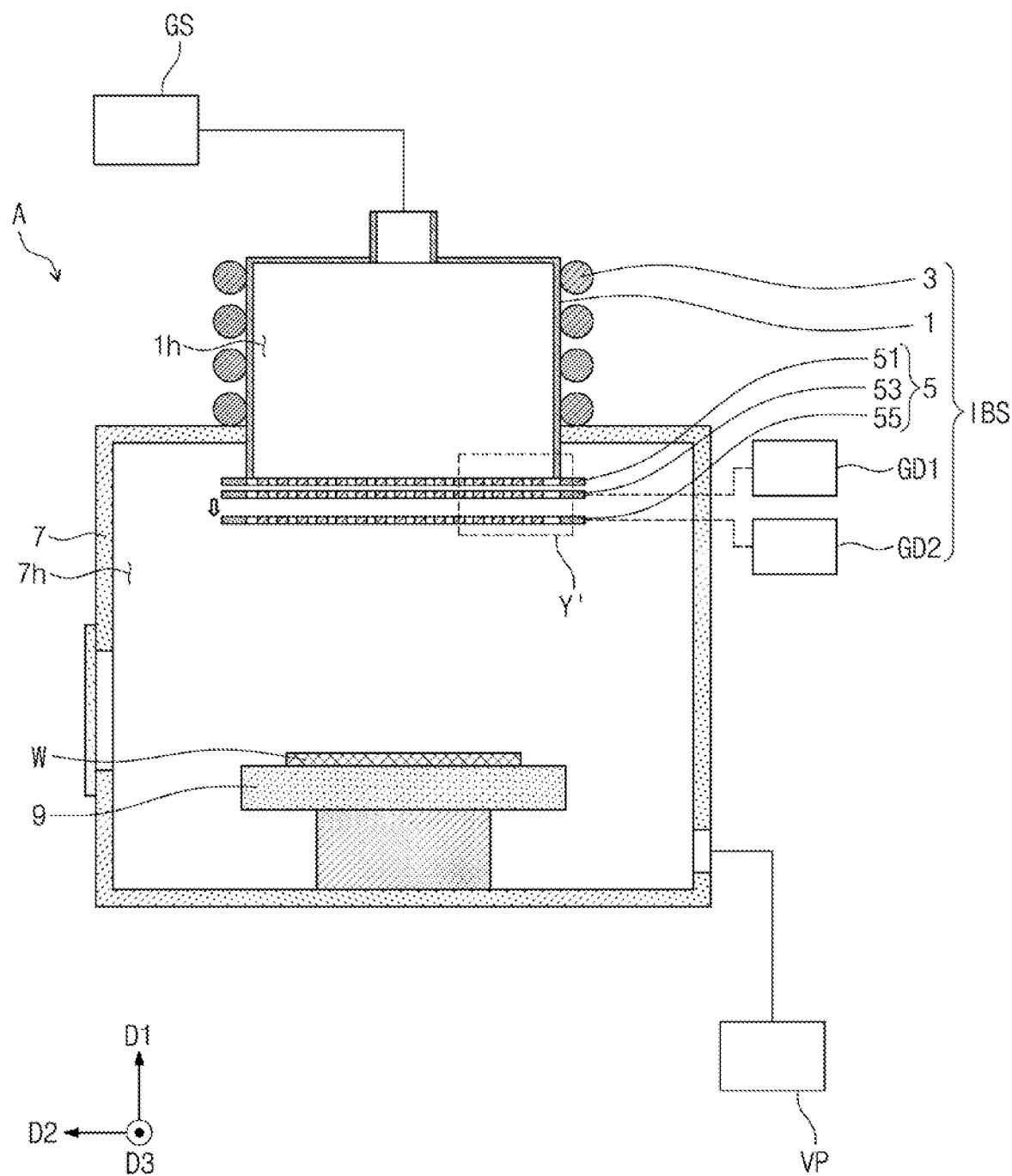
FIGS. 11 and 12 are diagrams illustrating a substrate processing method according to the flow chart of FIG. 4.
Figure 12:
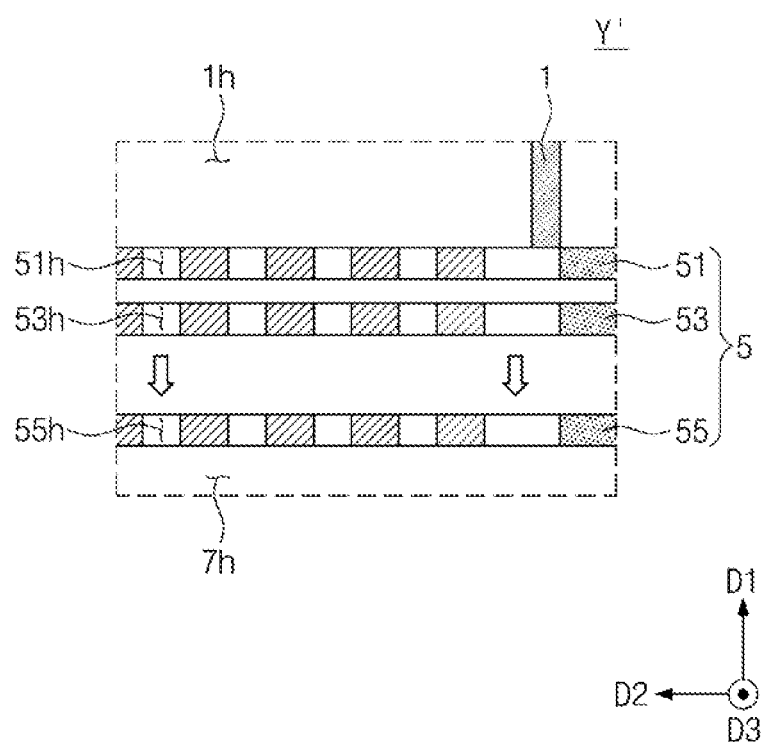

FIGS. 11 and 12 are diagrams illustrating a substrate processing method according to the flow chart of FIG. 4.

In the following description, for concise description, elements previously described with reference to FIGS. 1 to 10 may be identified by the same reference number without repeating an overlapping description thereof.

Referring to FIGS. 11, 12, and 4, the moving of at least one of the grids (in S1) may include moving the third grid 55 relative to the second grid 53 using the second grid driver GD2. For example, the second grid driver GD2 may be configured to move the third grid 55 in a vertical direction. More specifically, when the second grid 53 is fixed at a specific position, the third grid 55 may be moved in the first direction D1 by the second grid driver GD2. This may lead to a change in an energy of an ion beam extracted from the plasma chamber 1.

In the ion beam source according to an embodiment, a substrate process apparatus including the same, and a method of processing a substrate using the same, it may be possible to adjust a distance between the grids. In this case, an ion beam extracted from the plasma may be controlled.

Figure 13:
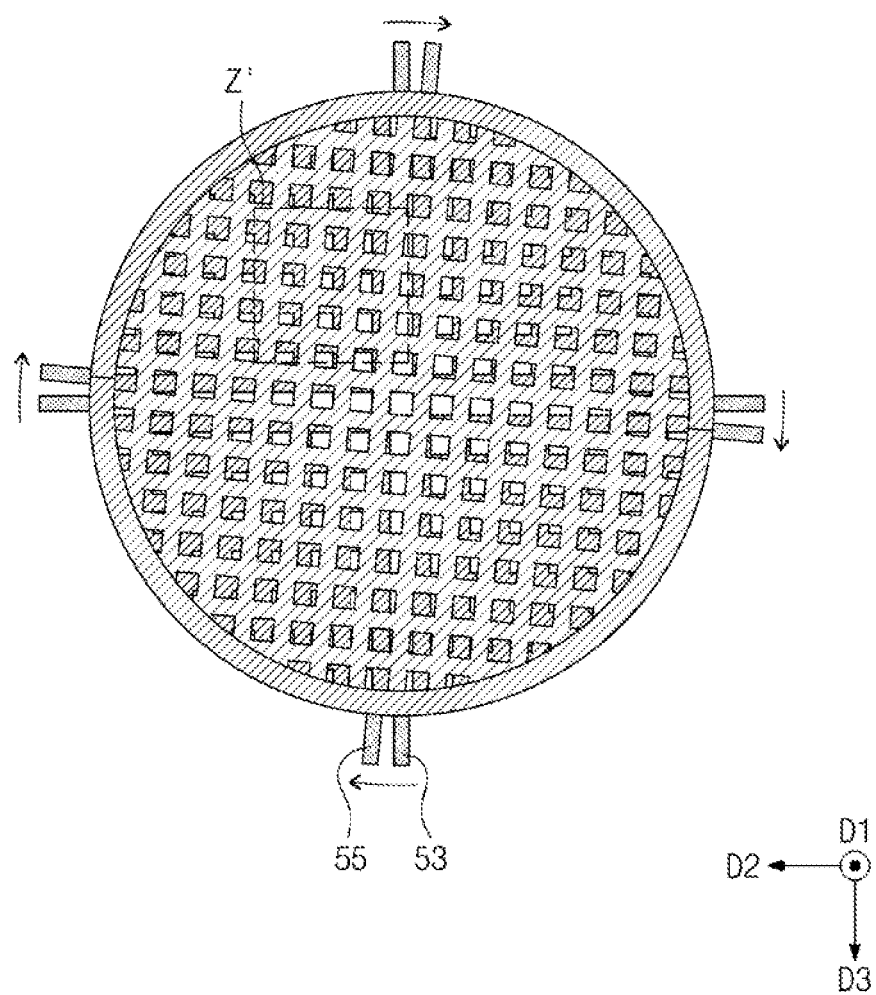
FIGS. 13 and 14 are diagrams illustrating a substrate processing method according to the flow chart of FIG. 4.
Figure 14:
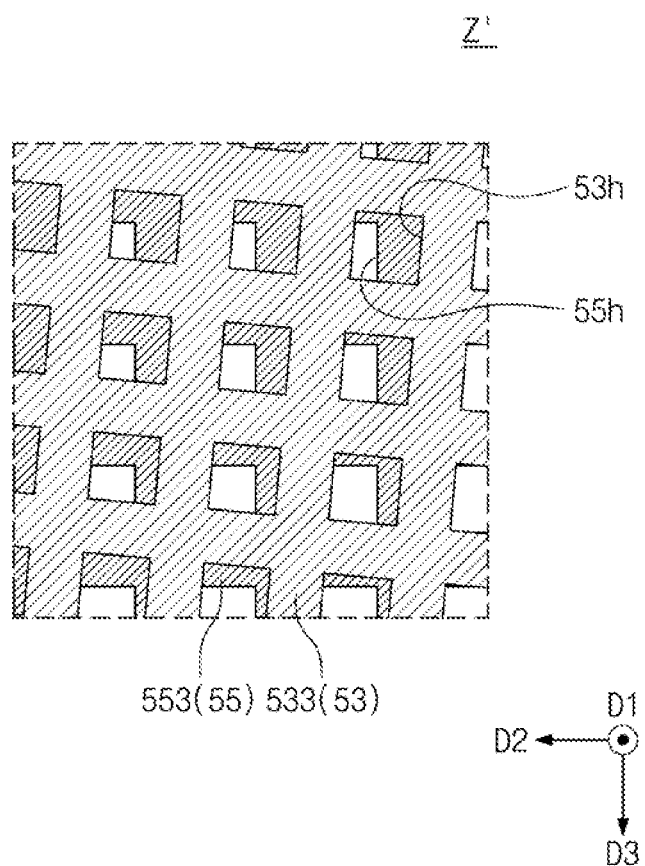

FIGS. 13 and 14 are diagrams illustrating a substrate processing method according to the flow chart of FIG. 4.

In the following description, for concise description, elements previously described with reference to FIGS. 1 to 12 may be identified by the same reference number without repeating an overlapping description thereof.

Referring to FIGS. 13, 14, and 4, the moving of at least one of the grids (in S1) may include moving the third grid 55 relative to the second grid 53 using the second grid driver GD2. For example, the second grid driver GD2 may be configured to rotate the third grid 55. More specifically, when the second grid 53 is fixed at a specific position, the third grid 55 may be rotated about an axis parallel to the first direction D1 by the second grid driver GD2. Accordingly, the grid penetration hole 55h of the third grid 55 may be misaligned or offset from the grid penetration hole 53h of the second grid 53. In other words, when viewed in a plan view, an area of an overlap region between the grid penetration holes 55h and 53h of the third and second grids 55 and 53 may be changed. For example, as shown in FIG. 9, the area of the overlap region between the grid penetration holes 55h and 53h of the third and second grids 55 and 53 may be reduced by the rotation of the third grid 55. This may lead to a change in an energy of an ion beam extracted from the plasma chamber 1.

Figure 15:
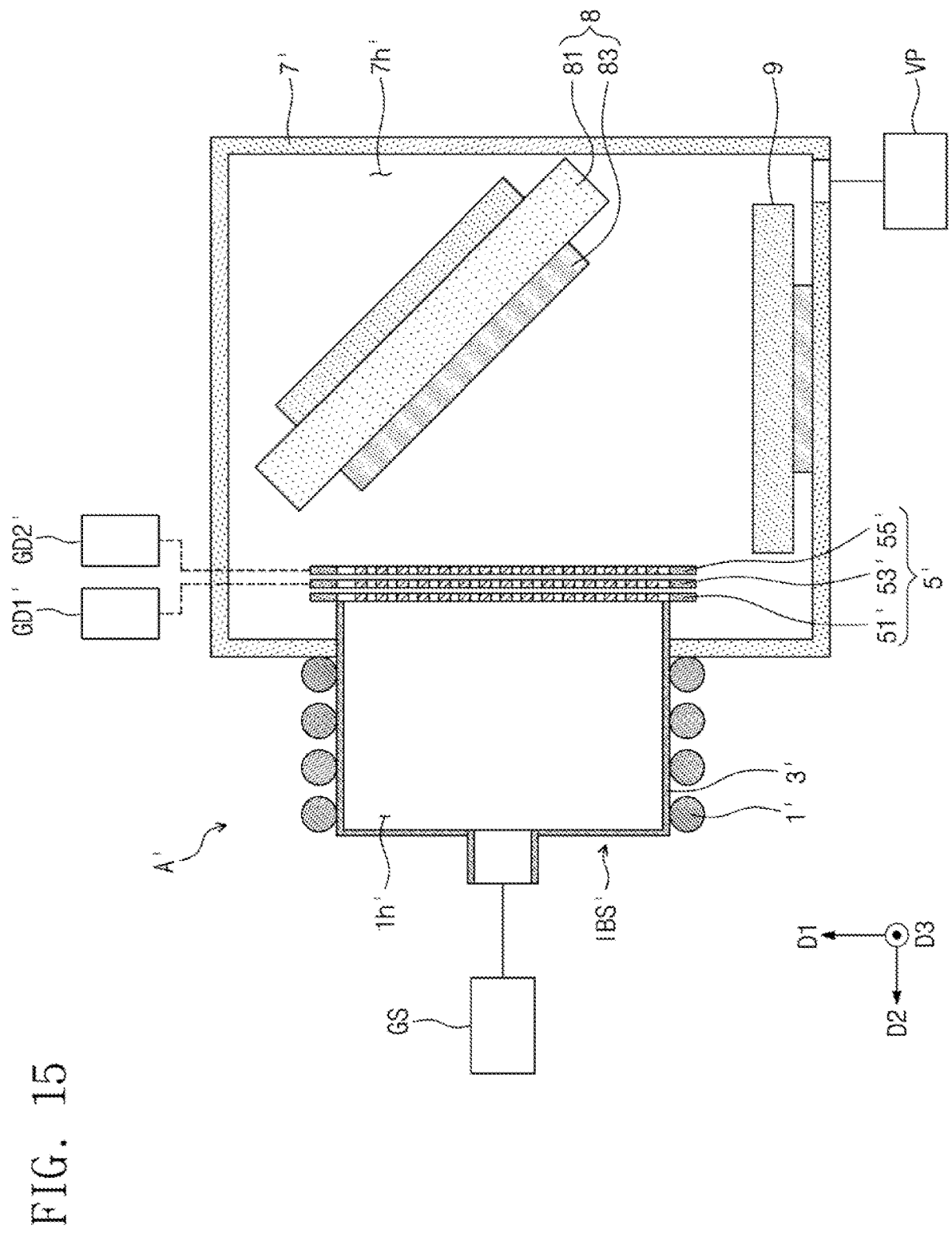
FIG. 15 is a sectional view illustrating a substrate process apparatus according to an embodiment.

FIG. 15 is a sectional view illustrating a substrate process apparatus according to an embodiment.

In the following description, for concise description, elements previously described with reference to FIGS. 1 to 14 may be identified by the same reference number without repeating an overlapping description thereof.

Referring to FIG. 15, a substrate process apparatus A' may be provided. In an embodiment, the substrate process apparatus A' may be configured to perform a deposition process on a substrate. More specifically, the substrate process apparatus A' may be an ion beam deposition (IBD) apparatus, which can be used to form a deposition layer on a substrate using an ion beam. In this case, the substrate process apparatus A' may include an ion beam source IBS', a process chamber 7', a target portion 8, the substrate holder 9, the gas supplying part GS, and the vacuum pump VP.

An ion beam source IBD' may include a plasma chamber 1', a plasma generator 3', a grid 5', a process space 7h', and a grid driver GD1', GD2'. The grid 5' may include first grid 51', second grid 53' and third grid 55'. Components of the embodiment of FIG. 15 may have at least some similar or substantially the same features as those of the embodiment of FIG. 1. For example, each of the plasma chamber 1', the plasma generator 3', the grid 5', the first grid 51', the second grid 53', the third grid 55', the process space 7h' and the grid driver GD1', GD2' may be configured to have substantially the same features as that in the embodiment of FIG. 1.

The target portion 8 may be spaced apart from the ion beam source IBS' and the substrate holder 9. The target portion 8 may include a target plate 83 and a target holder 81.

The target plate 83 may include a target material. The target material may be a source material that will be deposited on a substrate on the substrate holder 9. The target plate 83 may be provided to have a circular plate shape, but embodiments are not limited to this example. The target holder 81 may be provided to support the target plate 83. When the target plate 83 is placed on the target holder 81, an ion beam from the ion beam source IBS' may be irradiated onto the target plate 83. The ion beam may be used for a sputtering process of the target material on the target plate 83. The target material sputtered by the ion beam may be deposited on the substrate, which is loaded on the substrate holder 9. As a result, a deposition layer may be formed on the substrate.

In an ion beam source according to an embodiment, a substrate process apparatus including the same, and a method of processing a substrate using the same, it may be possible to control an energy of an ion beam.

In an ion beam source according to an embodiment, a substrate process apparatus including the same, and a method of processing a substrate using the same, it may be possible to control a direction of an ion beam.

According to an embodiment, an ion beam source, a substrate process apparatus including the same, and a method of processing a substrate using the same may be adaptively used for various processes.

While aspects of example embodiments have been particularly shown and described, it will be understood by one of ordinary skill in the art that various changes in form and detail may be made therein without departing from the spirit and scope of the attached claims.

What is claimed is:
1. An ion beam source, comprising:
a plasma chamber comprising a plasma generating space;
a plasma generator configured to generate plasma in the plasma generating space;
a first grid connected to the plasma chamber;
a second grid connected to the plasma chamber; and
a first grid driver connected to the first grid,
wherein the first grid driver is configured to move the first grid relative to the second grid.

2. The ion beam source of claim 1, wherein each of the first grid and the second grid has a plate shape extending perpendicular to a first direction, and
  wherein the first grid and the second grid are spaced apart from each other in the first direction.

3. The ion beam source of claim 2, wherein the first grid driver is configured to move the first grid in a second direction crossing the first direction.

4. The ion beam source of claim 2, wherein the first grid driver is configured to rotate the first grid about an axis parallel to the first direction.

5. The ion beam source of claim 2, wherein the first grid driver is configured to move the first grid in the first direction.

6. The ion beam source of claim 1, further comprising a third grid connected to the plasma chamber.

7. The ion beam source of claim 6, further comprising a second grid driver connected to the second grid,
  wherein the second grid driver is configured to move the second grid relative to the third grid.

8. The ion beam source of claim 1, wherein each of the first grid and the second grid comprises at least one of stainless steel (SUS), carbon graphite, copper (Cu), or aluminum (Al).

9. A substrate process apparatus, comprising:
  an ion beam source; and
  a substrate holder spaced apart from the ion beam source,
  wherein the ion beam source comprises:
    a plasma chamber comprising a plasma generating space;
    a plasma generator configured to generate plasma in the plasma generating space;
    a plurality of grids connected to the plasma chamber; and
    a grid driver configured to move one of the plurality of grids relative to the other ones of the plurality of grids.

10. The substrate process apparatus of claim 9, wherein each of the plurality of grids comprises:
  a grid supporting member having a ring shape; and
  a plurality of blocking bars coupled to the grid supporting member,
  wherein a plurality of grid penetration holes are provided between the plurality of blocking bars.

11. The substrate process apparatus of claim 10, wherein the plurality of grid penetration holes have a rectangular shape, when viewed in a plan view.

12. The substrate process apparatus of claim 9, wherein the plasma generator comprises an RF coil that surrounds the plasma chamber.

13. The substrate process apparatus of claim 9, wherein the plurality of grids comprises at least three grids.

14. The substrate process apparatus of claim 9, further comprising a target portion spaced apart from the ion beam source and the substrate holder,
  wherein the target portion comprises:
    a target plate; and
    a target holder supporting the target plate.

15. A substrate processing method, comprising:
  placing a substrate in a substrate process apparatus; and
  emitting an ion beam from an ion beam source spaced apart from the substrate,
  wherein the ion beam source comprises:
    a plasma chamber providing a plasma generating space;
    a plasma generator configured to generate plasma in the plasma generating space;
    a first grid connected to the plasma chamber;
    a second grid connected to the plasma chamber; and
    a first grid driver connected to the first grid,
  wherein the first grid driver is configured to move the first grid relative to the second grid.

16. The substrate processing method of claim 15, further comprising moving the first grid relative to the second grid using the first grid driver.

17. The substrate processing method of claim 16, wherein the moving of the first grid relative to the second grid comprises rotating the first grid relative to the second grid.

18. The substrate processing method of claim 16, wherein the moving of the first grid relative to the second grid comprises horizontally moving the first grid relative to the second grid.

19. The substrate processing method of claim 16, wherein the moving of the first grid relative to the second grid comprises moving the first grid toward the second grid to change a distance between the first grid and the second grid.

20. The substrate processing method of claim 15, wherein the emitting of the ion beam from the ion beam source comprises processing the substrate using the ion beam.

* * * * *